(12) United States Patent
Hartley

(10) Patent No.: US 6,614,035 B2
(45) Date of Patent: Sep. 2, 2003

(54) MULTI-BEAM SHAPED BEAM LITHOGRAPHY SYSTEM

(75) Inventor: John G. Hartley, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/059,786

(22) Filed: Jan. 30, 2002

(65) Prior Publication Data

US 2003/0141462 A1 Jul. 31, 2003

(51) Int. Cl.[7] ................................................ G03F 9/00
(52) U.S. Cl. ................ 250/492.23; 355/53; 250/492.2; 250/505.1
(58) Field of Search .................. 250/492.2, 492.23, 250/491, 423 F, 505.1; 355/53

(56) References Cited

U.S. PATENT DOCUMENTS

| | | | | |
|---|---|---|---|---|
| 4,899,060 A | * | 2/1990 | Lischke | 250/505.1 |
| 4,996,441 A | * | 2/1991 | Lischke | 250/492.2 |
| 6,014,200 A | * | 1/2000 | Sogard et al. | 355/53 |
| 6,157,039 A | * | 12/2000 | Mankos | 250/492.2 |
| 6,175,122 B1 | * | 1/2001 | Groves et al. | 250/492.23 |
| 6,194,732 B1 | * | 2/2001 | Okino | 250/491.1 |
| 6,323,499 B1 | * | 11/2001 | Muraki et al. | 250/492.22 |

* cited by examiner

Primary Examiner—Dorothy Bell
Assistant Examiner—Phillip A. Johnston
(74) Attorney, Agent, or Firm—Daryl K. Neff; Jay H. Anderson

(57) ABSTRACT

A multi-beam shaped-beam electron beam lithography system employs conventional lenses and magnetic deflectors, with an array of lithographically fabricated electrodes disposed about a central axis to simultaneously and independently deflect electron beams in beamlet exposure ranges separated transversely from one another within a subfield, so that subfields overlap.

8 Claims, 11 Drawing Sheets

MULTI-BEAM SHAPED BEAM LITHOGRAPHY SYSTEM

FIELD OF THE INVENTION

The field of the invention is shaped-beam electron beam systems employing simultaneous multiple beams.

BACKGROUND OF THE INVENTION

As circuit dimensions continue to shrink while device complexity grows, the number of pixels required to expose a chip pattern for reticle fabrication grows at an enormous rate. A mask writer with a high throughput has a strong competitive advantage over systems with lesser throughput. There are a number of ways in which mask writers have tried to gain an edge in throughput. For single pixel round beam systems, such as the Mebes 5500 manufactured by ETEC systems, the solution has been to increase the brightness of the pixel in order to decrease the time required to expose the pixel. This, coupled with a fast blanking system and a large pixel that compromises resolution for speed has permitted this technology to remain competitive through the 130 nm node, possibly to the 100 nm node. Those skilled in the art doubt that this technology is extendable to the 70 nm node and below. Another approach to enhancing the throughput of a mask writer has been to expose pixels in parallel. This has been accomplished in the IBM EL- series of mask writers through the use of a variable shaped spot. In this way, hundreds to thousands of pixels may be exposed in parallel. Since the brightness is usually less than that of a single pixel system, the net gain in throughput of a variable shaped beam system over a single pixel system is usually on the order of 5–10X. Other systems have taken the parallel pixel scheme even further, such as a character projection system found in systems by Hitachi or the projection e-beam steppers, such as the IBM/Nikon Prevail program. Neither of these are suitable for maskmaking, the character projection system does not have the flexibility to deal with the spectrum of features to be found on all masks, while Prevail is a wafer writer and requires the use of a reticle for the exposure.

For a shaped beam system to be efficient, the full spot should not be too much larger than the typical feature found in the pattern. If it is, beam current that could be used to expose the pattern is being wasted as it is masked off on the shaping aperture. It is estimated that by the time the 50 nm node is reached, a shaped beam system would be required to flash over 1 trillion spots to form a mask. In order to complete a mask in under 4 hours, no more than 10 ns can be spent exposing the average spot. Timing granularity for precise dose control would be required to operate in the 25–50 ps range. For a single spot shaped beam system, this represents a formidable challenge. One way to address this situation is to use multiple shaped beams in parallel. Four beams at 40 ns, can provide the same throughput as a single beam at 10 ns, while 16 beams can operate at the rather pedestrian rate of 160 ns and still accomplish what one beam can do in 10 ns.

Multiple round beams have been known as a throughput advantage for some time. They are commonly used in laser writers, such as the Alta series of tools manufactured by ETEC. Arrays of microcolumns, such as demonstrated by Chang et. al. are a form of round electron multibeam concepts. Groves and Kendall (U.S. Ser. No. 05/981962 & U.S. Ser. No. 05/962859) have described a multibeam shaped beam lithography system that makes use of uniform electric and magnetic fields to form images from a microlithographic shaping system. The distributed system described by Groves and Kendall also employs a separate contrast aperture for each beamlet, eliminating problems with Coulomb interactions. The lithography system they describe is fundamentally different from the step and repeat architecture used in the IBM EL-series of mask writers and could not be retrofitted onto a single spot system. The 1:1 imaging between the apertures and the target in the Groves and Kendall system places very stringent requirements on the aperture for good image fidelity.

SUMMARY OF THE INVENTION

The invention relates to a multiple shaped beam system that is compatible with existing single spot shaped beam system, allowing a single shaped spot system to be upgraded to a multibeam system.

A feature of the invention is the use of a datapath for driving the multibeam column, that makes full use of an existing shaped beam data path, together with the extensions that enable a multibeam environment.

Another feature of the invention is the addition of a new section of the system that displaces the set of n shaped beamlets to desired relative position after which the set of beamlets is directed as a whole onto the wafer or other workpiece.

DESCRIPTION OF THE PREFERRED EMBODIMENT

Figure 2:
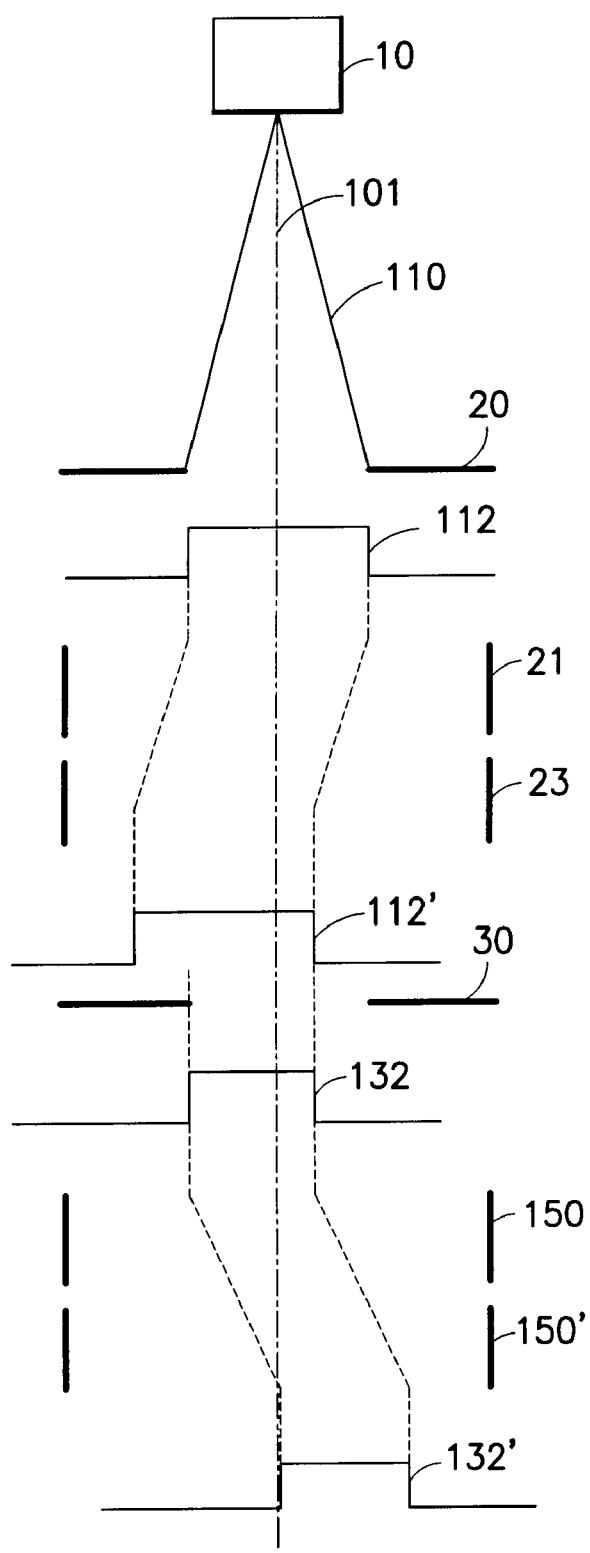
FIG. 2 shows, in partially pictorial, partially schematic form, a cross section of a prior art shaped-beam system.

FIG. 2 shows a prior art single beam shaped spot system. Throughout most of this disclosure, the invention will be described in terms of a 4 beam system, for convenience in presenting the drawings. For clarity, lenses, contrast apertures, alignment and magnetic deflection coils have been left out. Those skilled in the art will readily be able to add such elements in the light of the following description.

At the top of FIG. 2, electron gun 10 generates a beam 110 that travels along system axis 101, initially diverging. This figure shows a cross section taken through the system axis. Symmetric elements, such as beam deflectors, will be placed before and behind the plane of the paper, as is conventional. A first shaping aperture in plate 20 rejects the outer portions of beam 110, leaving the center to form a square, illustratively on the order of 1 μm on a side. Illustratively, there will be a lens centered on the plane of plate 20 that forms a beam focused on infinity. Just below plate 20, there is a line that illustrates the intensity of the beam in the vertical direction (in an arbitrary scale) at locations in the horizontal direction at the same scale as the Figure. This drawing convention will be used in other Figures illustrating the system or portions of it.

Below plate 20, a set of shaping deflectors 21 and 23 deflect beam 112 away from the system axis and then back parallel to it. This deflected beam 112' strikes plate 30, having a second shaping aperture. The amount of offset of beam 112' in the left-right and front-back directions will define a shaped beam 132 having a desired rectangular shape. This intermediate section between plates 20 and 30 will be referred to as the beam shaping section.

At the bottom of the Figure, deflectors 150 and 150' in the positioning section deflect the shaped beam emerging from the shaping section to the desired location on the workpiece, indicated by line 132'. Illustratively, a lens forms an image of the aperture in plate 20 on to the workpiece. Distortion correction elements, such as quadruples and octuple are placed within the system as is convenient (or as is practical, since space is always limited).

As those skilled in the art are aware, modern shaped-beam systems employ a deflection hierarchy of electrostatic deflection, magnetic deflection, and mechanical displacement of the stage holding the workpiece. These deflection systems have increasing range of deflection and decreasing speed, so that electrostatic deflectors will stitch shaped beam rectangles within their limited range, after which the system pauses while the magnetic deflectors shift to a new central position for electrostatic stitching. When the limit of magnetic deflection is reached, the system pauses for a longer time while the stage shifts to a new range for the magnetic deflectors.

Such systems have been used commercially in writing masks and in direct-write of semiconductor wafers. As discussed above, higher throughput systems having multiple beams will be required for commercially viable throughput in the foreseeable future.

The present invention improves throughput by packaging a set of multiple shaping plates and apertures, together with deflectors, into the same footprint currently used by the single beam system, so that there is no need to scale lenses and magnetic deflection coils to a larger size.

Figure 1:
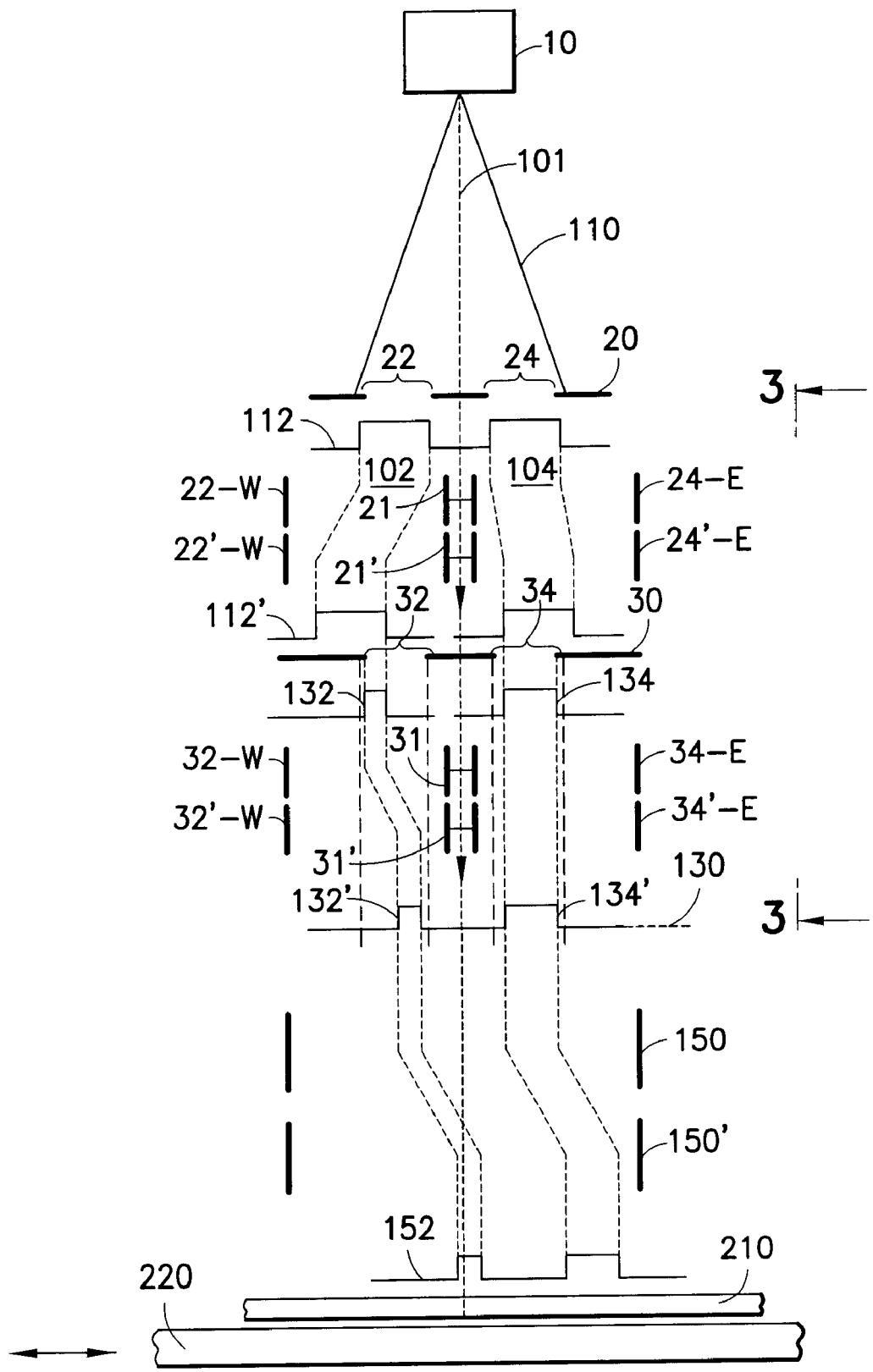
FIG. 1 shows, in partially pictorial, partially schematic form a cross section of the inventive system.

Referring now to FIG. 1 a cross section of a four-beam system corresponding to FIG. 2 is displayed. In this case, the section is taken through 2 of 4 apertures, referred to as apertures 22 and 24. The top section that generates the beam is the same.

The next section, which defines N beamlets in plate 20 (in this case, N=4) has a set of four independently driven electrostatic deflectors (referred to as 22-W and 22'-W and 24-E and 24'-E, in notation that will be explained with respect to FIG. 4) that define 4 shaped beamlets on apertures in plate 30. The beam intensity distribution is shown in line 112, just after the first shaping apertures and in line 112', showing displacement relative to second shaping apertures 32 and 34.

The intensity distributions of the shaped beams emerging from the second shaping apertures are shown in lines 132 and 134. Note that beam 132 is at the left (also referred to as West) edge of aperture 32 and beam 134 is at the right (also referred to as East) edge of aperture 34. In the third section, a second set of electrostatic beamlet deflectors (32-W, 32'-W, 34-E and 34'-E) shifts beams 132 and 134 to new positions that have the desired relative placement between the beamlets, but need to be displaced as a whole to the desired position (indicated on line 152) on workpiece 210, which is mounted on stage 220.

Figure 3:
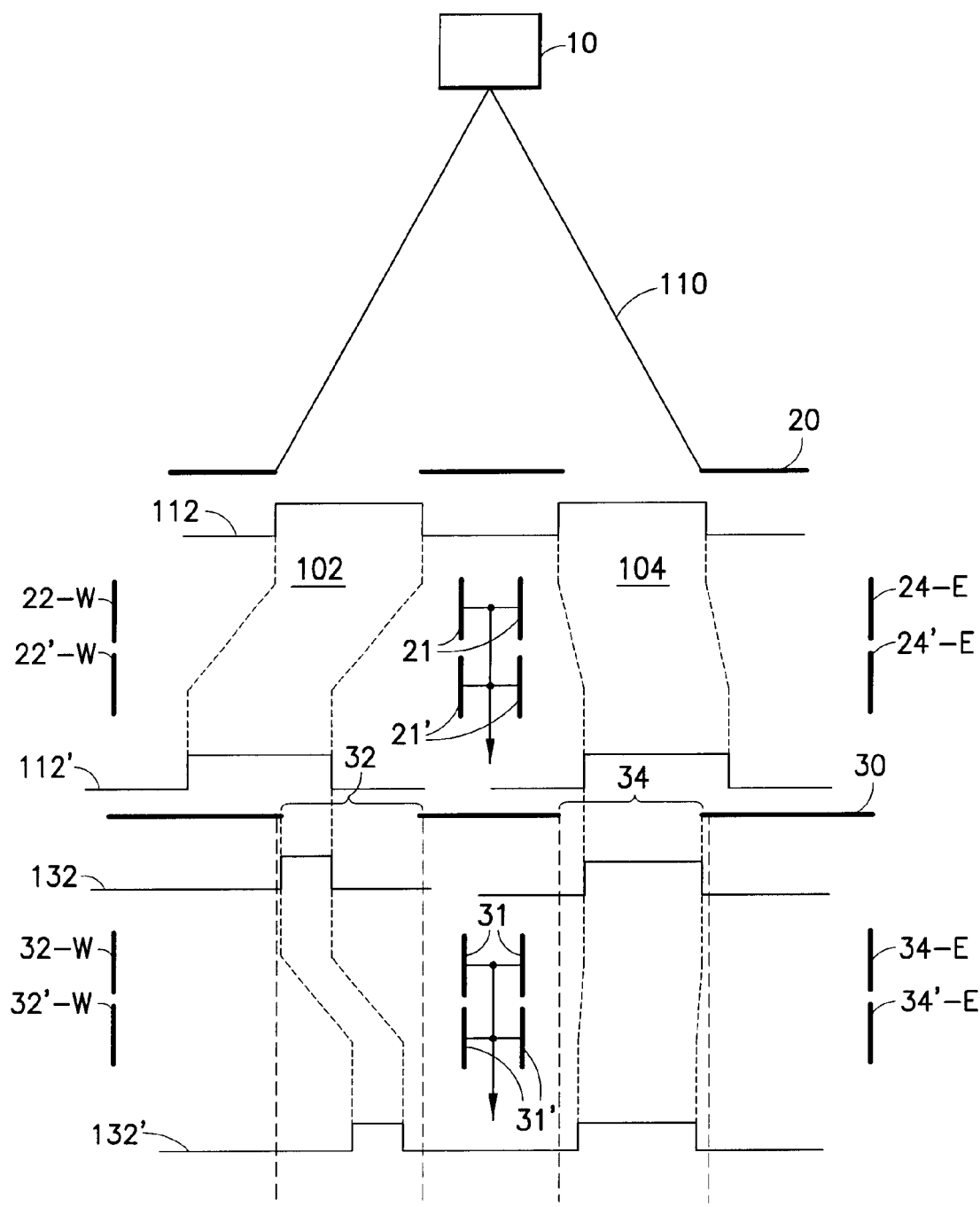
FIG. 3 shows an enlarged view of a portion of the system of FIG. 2.

FIG. 3 shows an enlarged detail of the section of FIG. 1 denoted by bracket 3—3. The limits of the multibeam shaping apertures in plate 20 for the multibeam column correspond to the same limits as the open area on the single shaping aperture. By way of example, if the first shaping aperture in the single beam column has an opening of 240 μm on a side, the 4 beam aperture would have 4 openings 80 μm on a side, separated by 80 μm struts, showing in more detail in FIG. 4. Thus, there is no need to redesign the first beam generating module of the system when upgrading from a single-beam system to a four-beam system.

Figure 4:
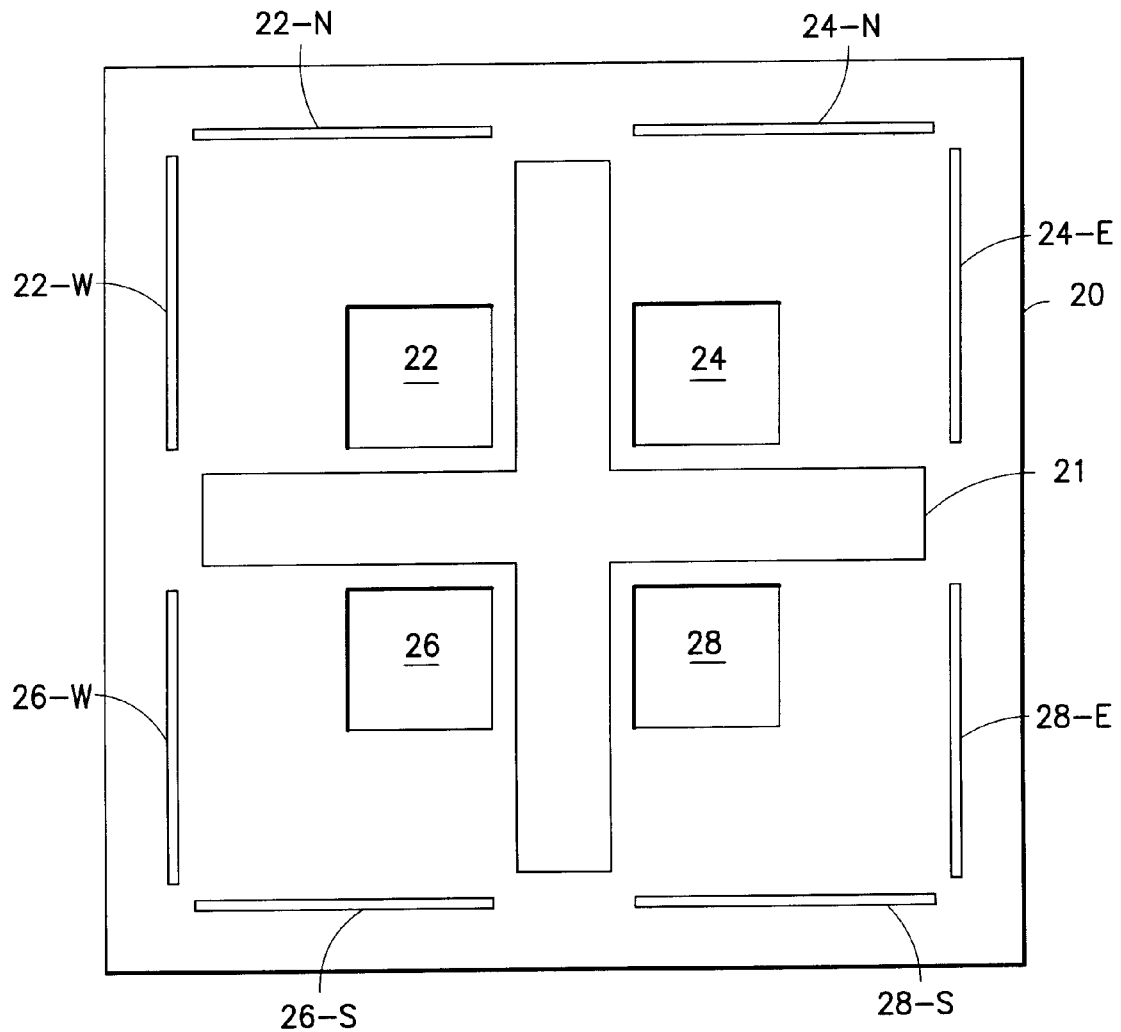
FIG. 4 shows a plan view of a set of four beamlet-shaping apertures.

FIG. 4 is a plan view of the first shaping apertures in plate 20. For convenience in description, various electrodes will be described as being North, South, East or West, relative to the center of plate 20. Aperture 22 is in the northwest corner, etc. Below plate 20, (as can be seen in FIG. 3) a set of electrodes (22, 24, 26, 28) deflects the beams emerging from plate 20 to shape the four beamlets. Center electrode 21 is held at ground and the spots are shaped by deflecting outwards, away from the central electrodes (which are shown in FIG. 3 as tied together and held at ground as a packaging convenience, although they could be separated and driven).

Figure 5:
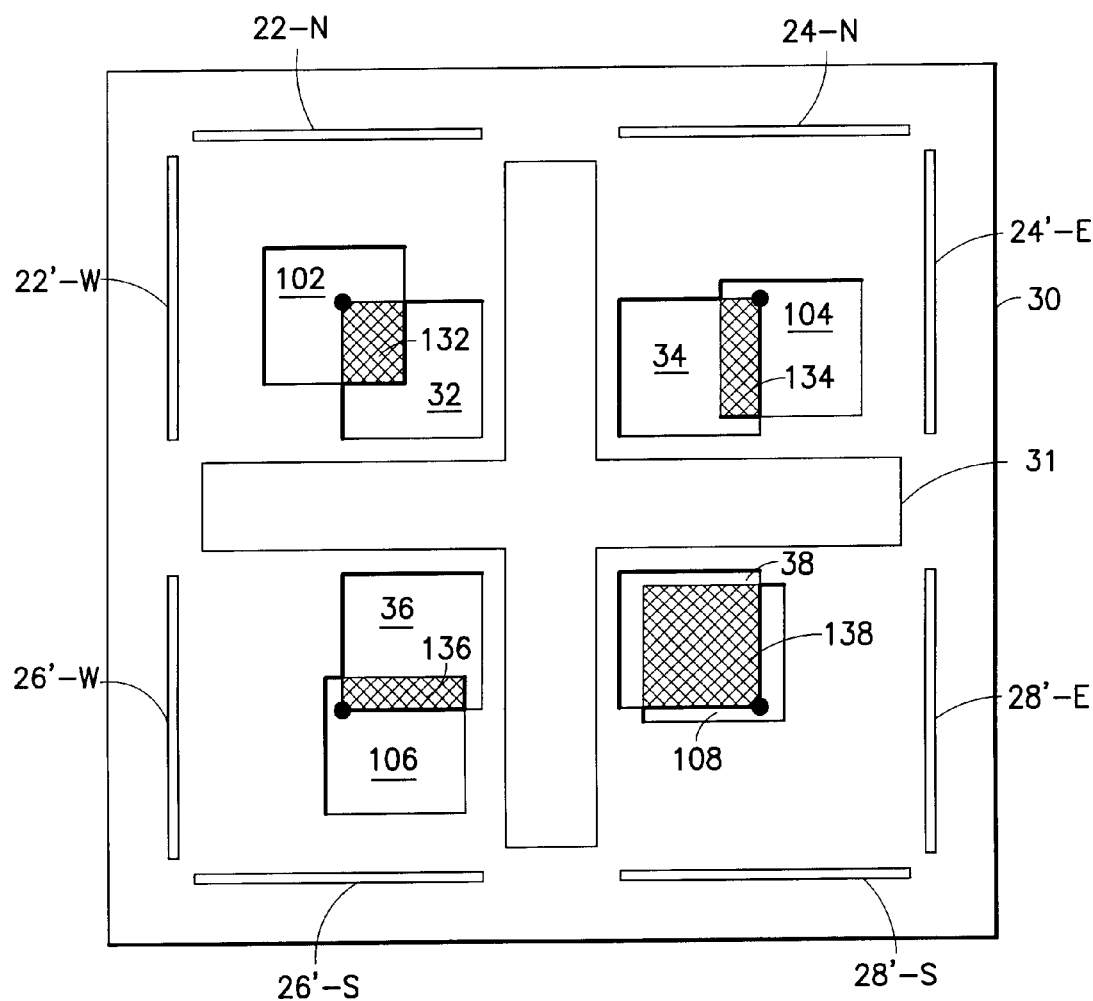
FIG. 5 shows a plan view of the same set of four beamlet-shaping apertures, with a set of beamlets being shaped.
Figure 6:
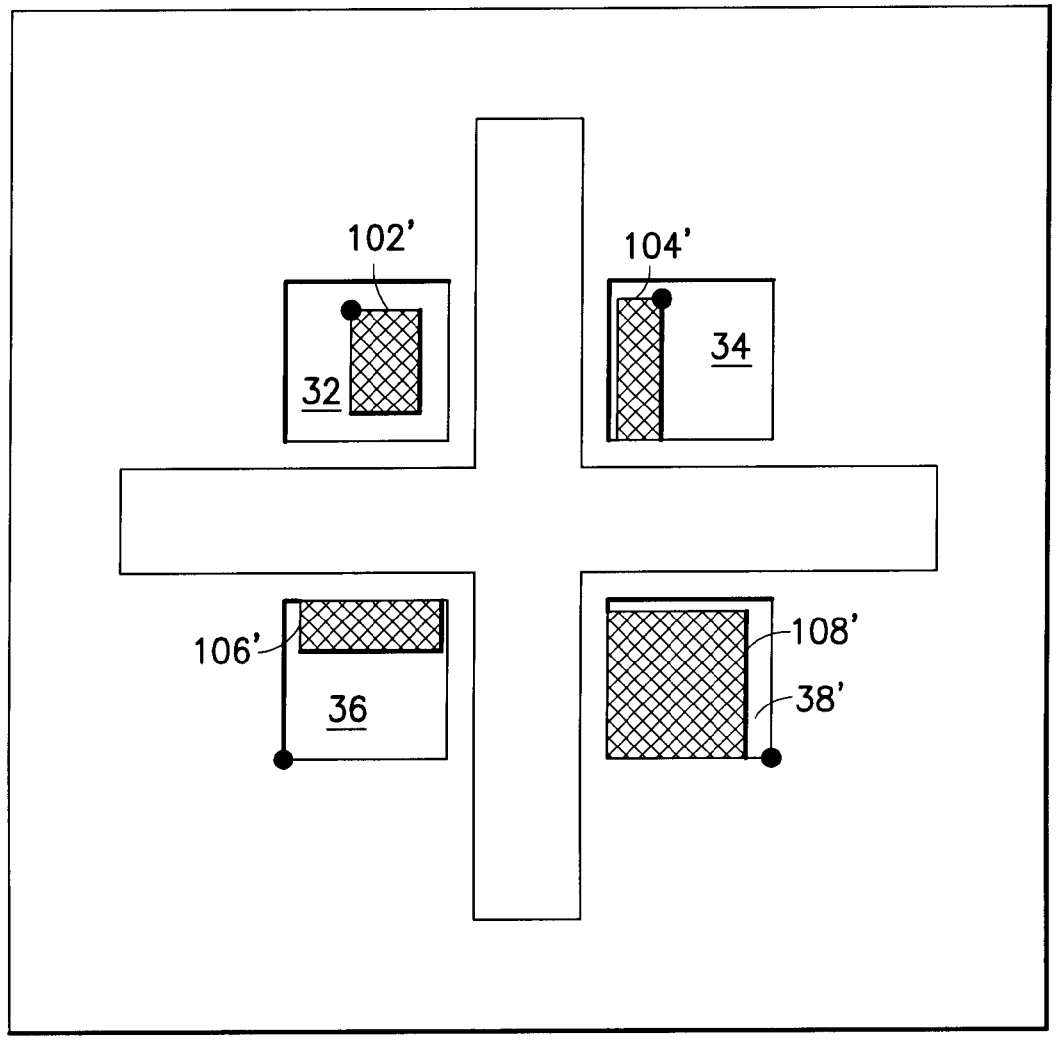
FIG. 6 shows a plan view of the same set of four beamlet-shaping apertures, with the set of shaped beamlets having been displaced to the desired relative positions.

FIG. 5 shows a plan view of plate 30, which is disposed below the second set of beam shaping electrodes 22'-W, 24'-E, etc. It may be noticed that the stationary edges of the spot are not the same, but rather opposite; i.e. the four shaped beamlets are defined by wiping the excess beam off on the outer edges of the second shaping apertures. Referring to the NW corner, beam 102 is being wiped against aperture 32 in plate 30, leaving the cross-hatched shaped beamlet 132 to travel on through the system. For reference in other Figures, a dot indicates the intersection of the North and West edges of aperture 32. Similarly, beamlet 104 becomes shaped beamlet 134, beamlet 106 becomes shaped beamlet 136 and beamlet 108 becomes shaped beamlet 138. Upon exiting the second shaping apertures in plate 30, the shaped beamlets pass through a second set of beamlet deflectors (32-W and 32'-W, etc. in FIG. 2) where they are deflected from their initial positions at the corners of the apertures 32–38 to any desired position within the boundary of each beamlet's second shaping aperture, as shown in FIG. 6. The net result is that within the area (bounded by the outer edges of the apertures 32–38) previously capable of holding a single shaped spot, 4 spots are shaped and positioned. This multispot image is now transferred down the column, where it is finally located on workpiece 210 in FIG. 1 with the aid of the position deflectors 150 and 150'. This image is the Kth image in a series of M images (or M transverse intensity distributions) that may be on the order of $10^{12}$ and that together form the pattern of a layer of an integrated circuit or other workpiece.

Figure 7:
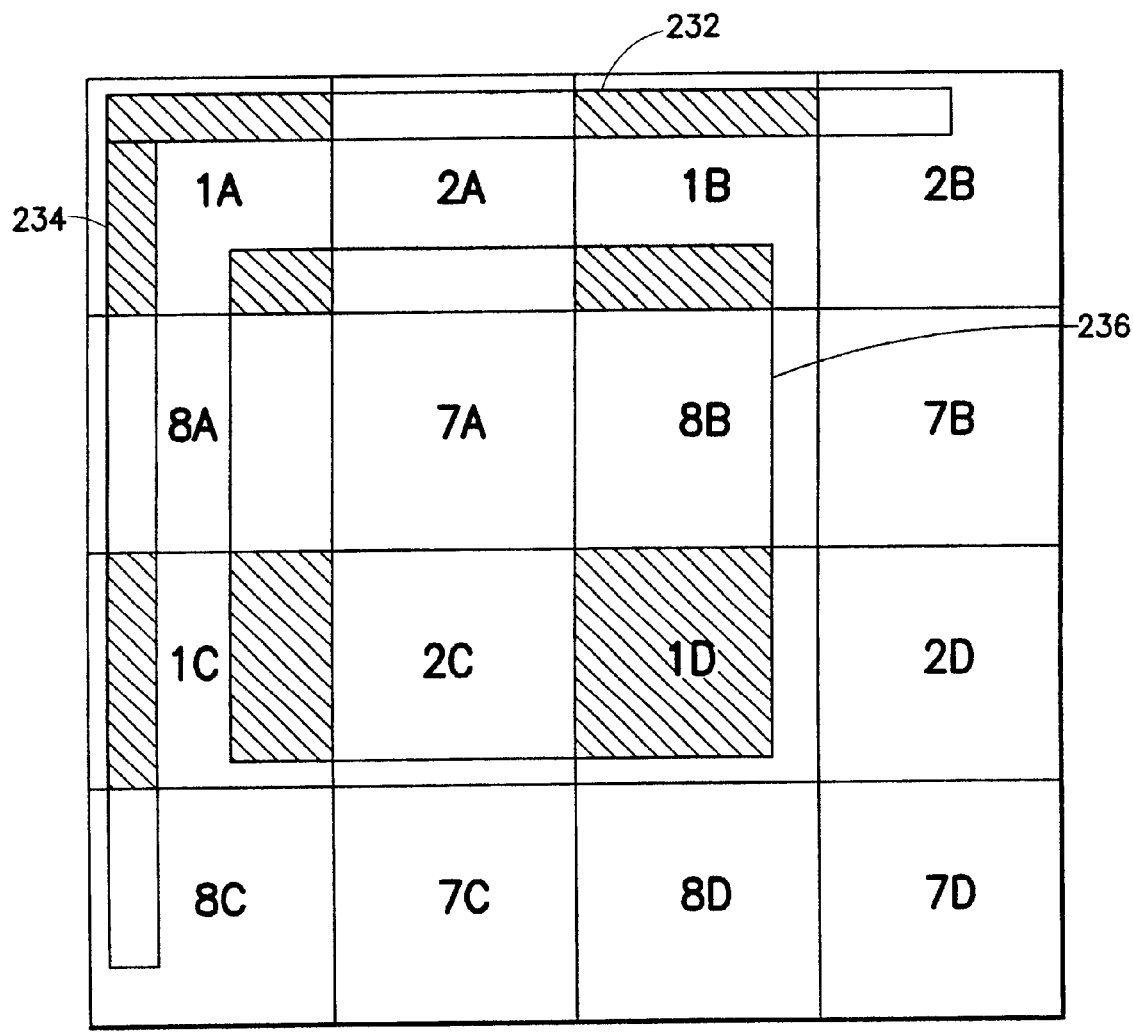
FIG. 7 shows a plan view of a portion of a workpiece, showing a set of subfields and an illustrative set of exposed areas to be exposed by the shaped beamlets from the system.

FIG. 7 shows the final result below the beamlet deflector plates. Each of the beamlets has been deflected to its required position. It was mentioned previously, that the position deflectors are allowed to extend slightly beyond the limits of the 2nd aperture boundary. This is to allow for the possibility that a rectangle definition may extend beyond a beamlet cell boundary by a single or a few least significant bits. In that case we could end up with a situation where a "sliver" of a rectangle is left to be exposed by its neighboring cell. "Slivers" are defined as shapes that are too small to resolve well in the mask writing process.

FIG. 7 shows a representative "subfield" (1A, 1B, 1C and 1D) interspersed with and overlapping other subfields to fill in the total area. Three rectangles 232, 234 and 236 on the wafer illustrate the filling strategy. In a single shaped beam system having a subfield covering the outer limits of (1A, 1B, 1C and 1D) a portion of rectangle 232 (excluding the part located in area 2B) would be exposed in a flash; secondly, the part of rectangle 234 outside area 8C would be exposed. Rectangle 236 would be exposed in a third flash for this subfield. The portions of rectangles 232 and 234 located in areas 2B and 8C would be filled in later.

In the illustrated 4-beamlet system, beamlet A has 3 spots to expose, beamlet B and C each have 2 spots while beamlet D has only 1 spot. Beamlets will be blanked by being deflected on to the solid areas of plate 30 during flashes that are not used for that area. In the language used in the claims, there will still be 4 spots, some of which may have a zero intensity distribution when they are blanked. It is a limitation of this invention that the position deflectors 150, 150' cannot advance the beamlets to the next sector until all of the beamlets have completed their exposures. In practice, this limitation is not expected to be severe, as the feature density is anticipated to be such that on average, each beamlet sees approximately the same spot count. The rectangles 232, 234, 236 are for illustration purposes only and not intended to represent an actual design. It should be evident from FIGS. 7 and 6 that exposed areas are not immediately adjacent to each other, but separated by a distance equal to the "exposure range" of a beamlet. This has some additional advantages in that the energy deposited in the substrate during the exposure is spread out somewhat, thereby reducing the impact of resist heating effects. Some small advantages might be obtained against space charge effect as the beamlets are separated in space, except at the point where they pass through a crossover in the optic path.

Figure 8:
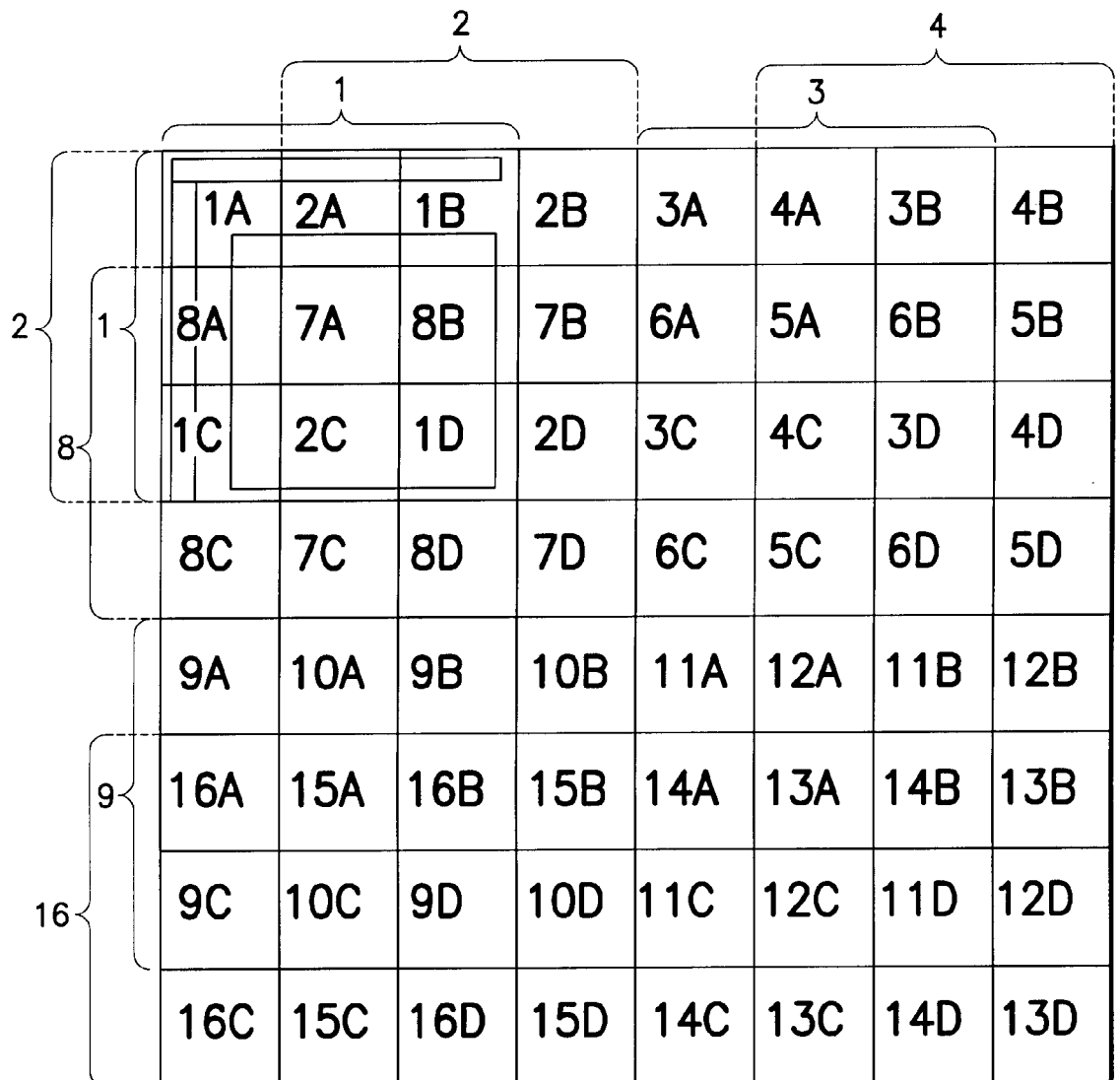
FIG. 8 shows a plan view of a portion of a workpiece, showing a set of subfields to illustrate the exposure and stepping sequence.
Figure 9:
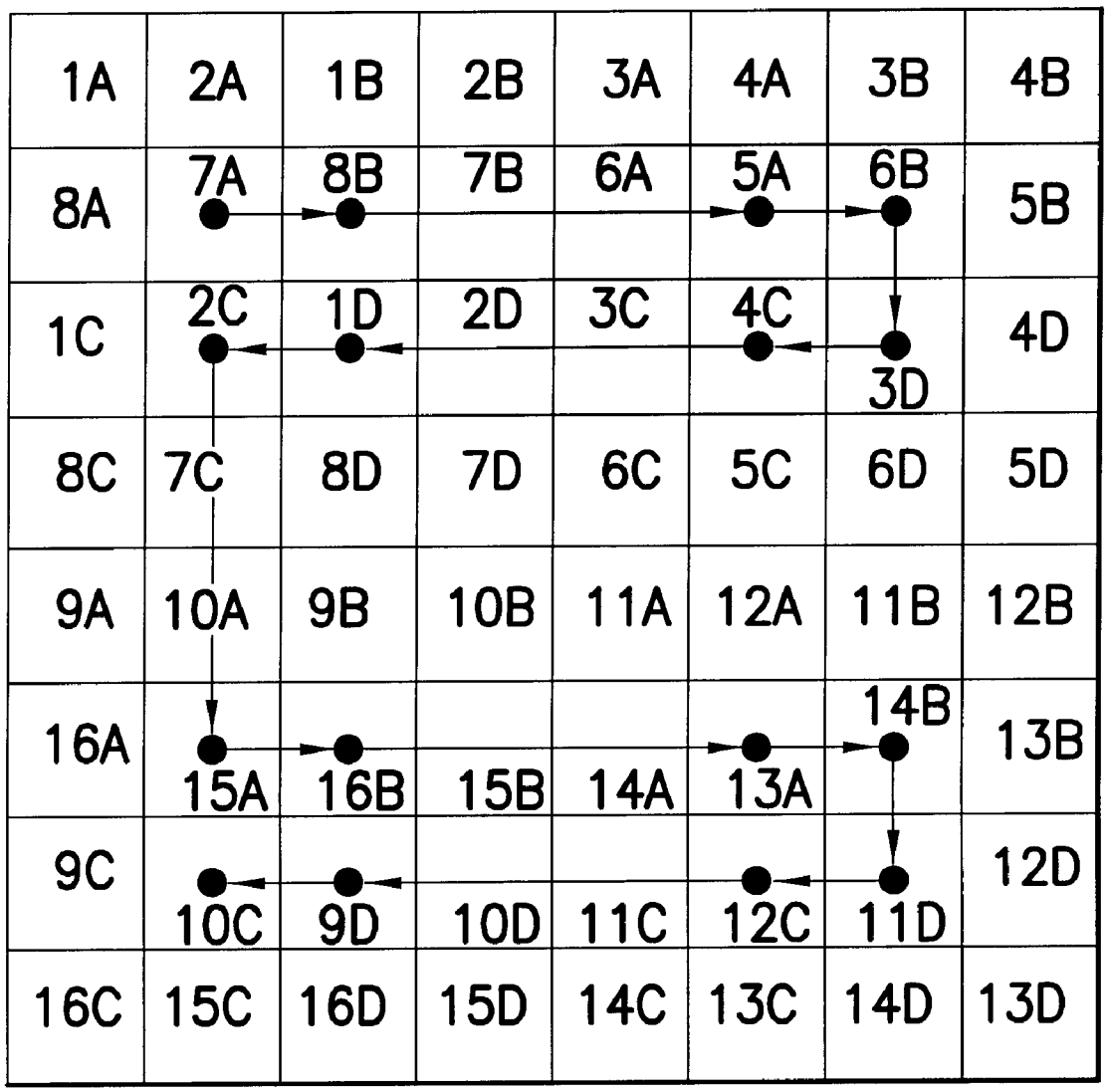
FIG. 9 shows a plan view of the same portion of a workpiece, showing the stepping sequence in more detail.

FIG. 8 shows the same pattern, expanded to cover an 8×8 array of exposure ranges. Areas having the same number are exposed by the four beamlets in the same subfield, with the position deflector stepping the beamlet clusters to 16 different locations to cover the total area. On the top, bracket 1 denotes the area covered by subfield 1 and bracket 2 does the same for subfield 2. Note that the subfields overlap, to fill in the opaque areas in plates 20 and 30. FIG. 9, together with FIG. 8, illustrates the writing strategy in more detail. Initially, the center of subfield 1 is on area 7A. When that subfield has been exposed, the subfield is stepped by one "beamlet range" —the distance covered by deflectors 32 and 32' (for a given value of deflectors 150 and 150'). The pattern is stepped four times horizontally, as denoted by brackets 1–4. This fills in two "stripes" (the first and third horizontal rows in FIG. 8). A second pass fills in the second and fourth rows, so that a 4×8 "module" is filled in by two passes. This two pass pattern is done four times to fill in an 8×8 subfield. For completeness in notation, a "subfield" is the area that can be covered by the n beamlets (again for a given value of deflectors 150 and 150'). A "field" is the area that can be covered without moving the stage (i.e. the sum of all subfields that can be exposed by exercising deflectors 150 and 150').

Figure 10:
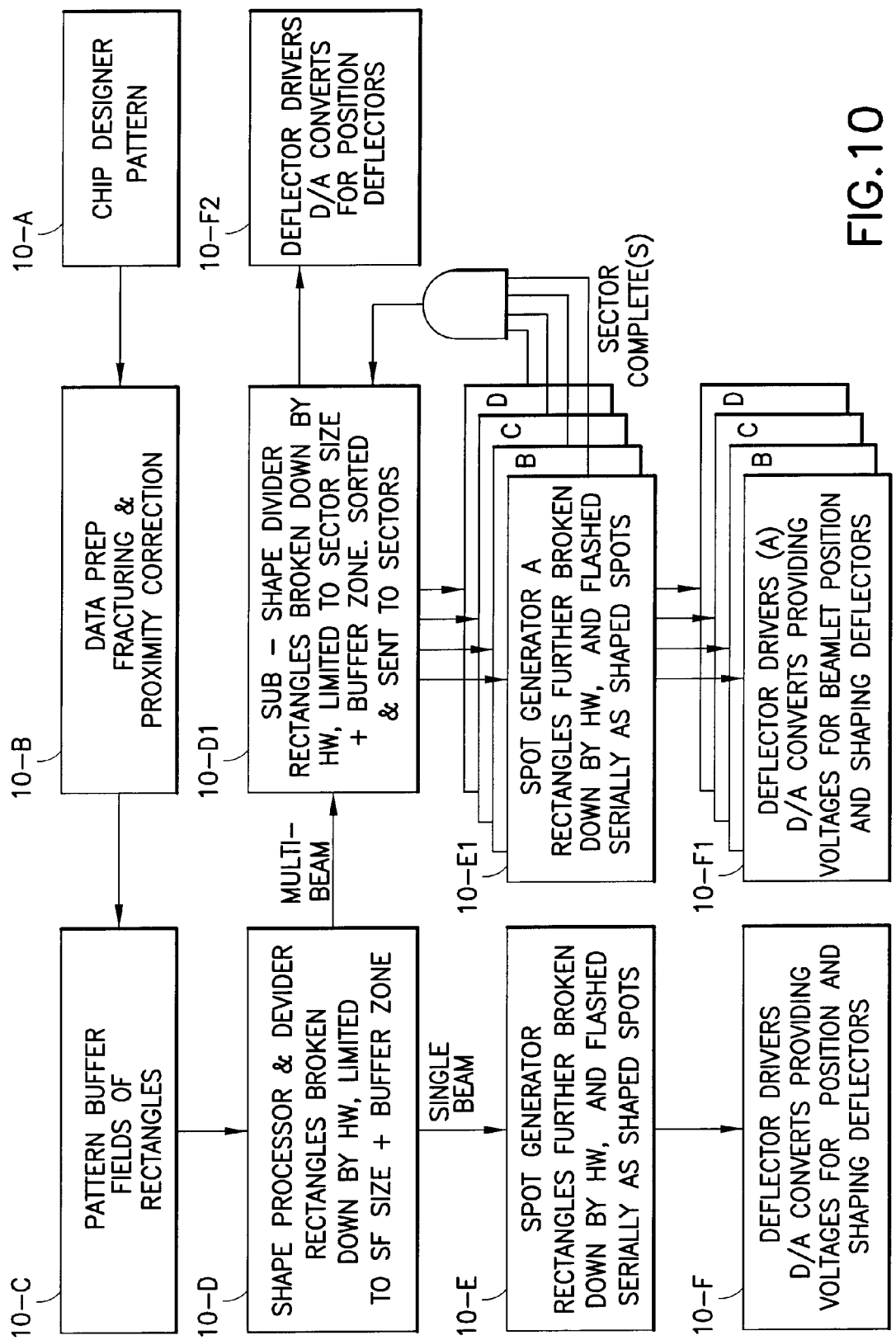
FIG. 10 shows a block diagram illustrating the flow and manipulation of the control data for a shaped multibeam column.

FIG. 10 shows the datapath for the multibeam system, using 4 beams for illustrative purposes. The path 10-A through 10-F is a high level summary of the data path as is used today in a single spot shaped beam system. The arrow leading to box 10-D1 indicates the start of the changes required to process a multibeam environment. The chip designer will generate a tape in standard GDS-2 (or equivalent) format that specifies the circuit. Box 10-B starts a software program, generically referred to as "post-processing" that accepts the GDS-2 tape as input and outputs a set of commands to drive the deflectors, etc. to expose the photoresist on the workpiece. The software represented by box 10-B performs the fracturing operation in which pattern data is subdivided into groups, each group sized to accommodate a single exposure field of the mask writer. An example of software for this purpose is "CATS" designed and marketed by Transcription Enterprises.

The data preparation performed in step 10-B may additionally perform "proximity correction" which may include manipulation of both dose and shape information for the purposes of compensating for electron scattering in the mask writer and for diffraction effects in the stepper that uses the mask.

The pattern buffer illustrated by box 10-C is the hardware memory unit of the mask exposure tool where the pattern data prepared in 10-B is temporarily stored while queued for exposure.

A fundamental element of any mask exposure tool is the translation of the pattern data described by some sort of graphics language (GDS-2, GL/1, others) into a set of commands that coordinate the position and shape of the electron beam together with the position of the workpiece being patterned to render a faithful image of the pattern described by the graphics language on to the mask. Since the description of the pattern in the graphics language is purely geometrical, without any assumed prior knowledge of the mask writer, it is expected that the geometrical elements of the pattern are likely to cross boundaries in the maskwriter hardware.

For a single-beam shaped beam system it is the function of boxes 10-B, C, D and E to divide the arbitrary geometrical shapes produced by the chip designer in box 10-A into a series of successively smaller shapes until the pattern is defined in terms of the primitive shapes that the mask writer exposes in a single flash. In this perspective, box 10-B compares the geometrical elements produced in box 10-A with the mask writer field size. Shapes that span field boundaries are split into new shapes lying within the fields in question and collected together with shapes that lie wholly within the field. The collection of fields that define the pattern are then stored in pattern buffer 10-C. Stage stepping controls the placement of the individual fields on the mask which are stitched together to render the pattern. Within each field, there will be shapes that cross subfield boundaries. Box 10-D (analogous on the subfield level to Box 10-B) identifies shapes that are wholly contained within subfield boundaries by comparing the extent of the shapes with the known location of the boundaries. This unit also identifies shapes that cross subfield boundaries and breaks them down into a series of shapes, each wholly contained within the subfield. These smaller shapes are assigned to their respective subfields. The shapes, now divided down to the subfield level, are then sequentially passed to the spot generator, box 10-E. The largest single element that a shaped beam system can expose is a full spot, typically square and up to 4 microns per side depending upon the technology generation targeted by the mask writer. Since the pattern data at this point entering the spot generator may contain shapes that span the subfield, it is the function of the spot generator to recreate the shapes from a set of appropriately shaped spots. The spot generator outputs digital words and clock signals which are converted to analog signals that drive deflection circuitry in box 10-F.

The summary description in the preceding paragraph covers the basic elements of a shaped beam datapath. Other features are present as well and are important in their own right, but are incidental to the multibeam concept. These include such items as proximity correction implemented in dose/size modulation techniques, spot sorting for exposure efficiency and modification of spot position for distortion corrections.

For implementation in a multi-beam environment, the set of shapes wholly contained in a subfield as determined by the shape processor, unit 10-D, are now passed to unit 10-D1, the sub-shape divider. The sub-shape divider essentially performs similar operations to unit 10-D, with the boundaries defined by the sectors as illustrated in FIG. 7. Again, we are likely to find shapes defined at the subfield level which cross sector boundaries, and again these are further divided down to smaller shapes that are wholly contained within the sectors. These subdivided shapes are then collected together according to their sector and an additional control code that signals the end of data for the sector. Once that is done, the beamlet rectangle coordinates must have the sector offset from the subfield origin subtracted, and depending upon which quadrant the rectangle is located in, the position must be adjusted for the size of the spot. This is due to the fact that all rectangles are initially formed with a corner at the outmost corner of the aperture in each quadrant. Since the spot position is referenced to the upper left corner of each aperture, the north-east quadrant requires the beamlet deflection in X be reduced by the width of the spot, in the south-west quadrant, the Y deflection is reduced by the height of the spot, while in the south-east quadrant both adjustments are necessary. The sector data is then fed to the spot generators 10-E1, one for each of the sectors. Each of the spot generators A through D processes its stream of rectangles, completing with the end of data signal. Upon processing the end of data signal, the sectors spot generator card asserts a Sector Complete signal. When all of the individual spot generator cards assert a Sector Complete, a signal reaches the sub shape divider which advances the position deflectors 150 & 150' to the next subfield. Deflector drivers 10-F1 are controlling deflectors 22 & 22' while deflector driver 10-F2 is controlling deflectors 150 & 150'.

Once that is done, the beamlet rectangle coordinates must have the sector offset from the subfield origin subtracted, and depending upon which quadrant the rectangle is located in, the position must be adjusted for the size of the spot. All rectangles are initially formed with a corner at the outmost corner of the aperture in each quadrant. Since the spot position is referenced to the upper left corner of each aperture, the B quadrant requires the beamlet deflection in X be reduced by the width of the spot, in the C quadrant, the Y deflection is reduced by the height of the spot, while in the D quadrant both adjustments are necessary.

Figure 11:
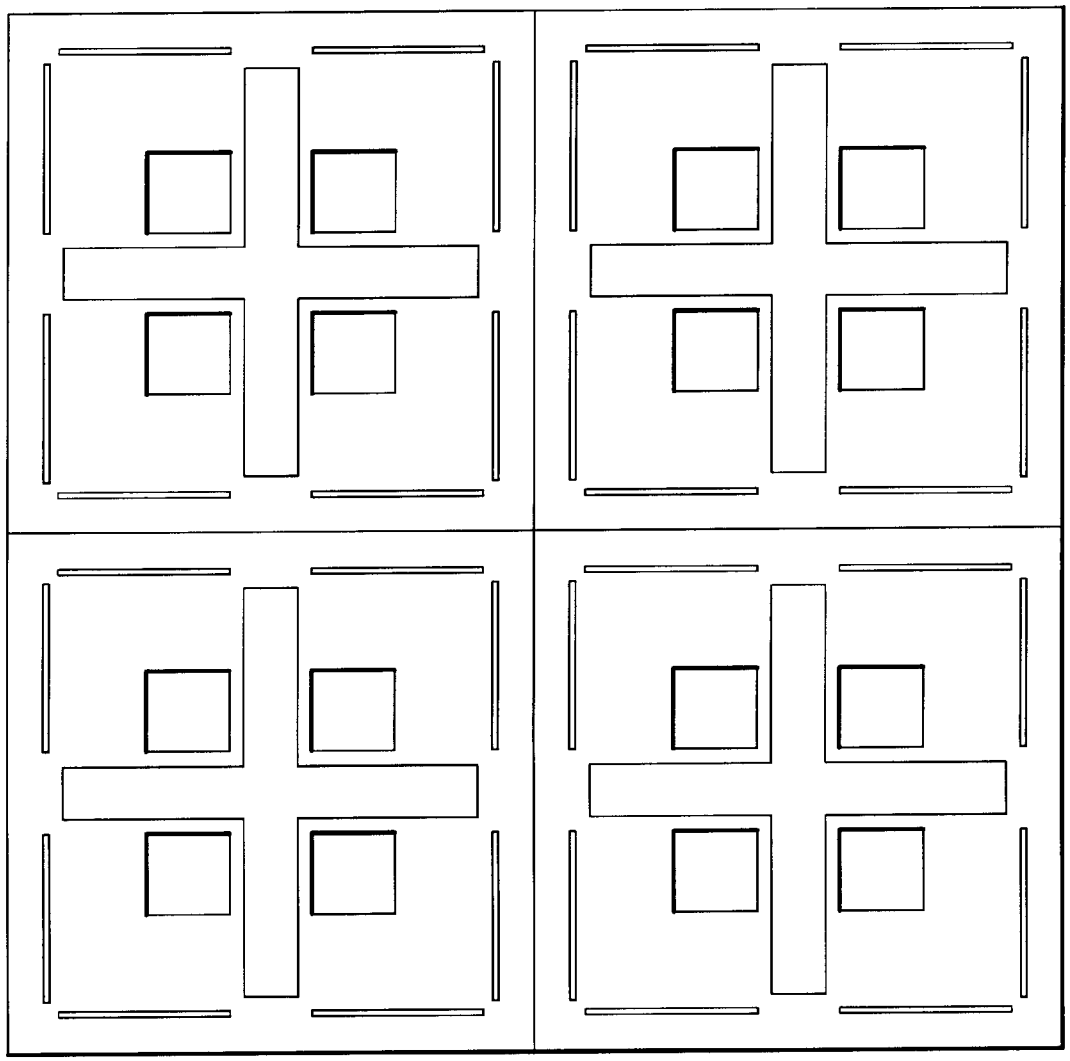
FIG. 11 shows a plan view of an alternative embodiment expanded to sixteen beams.

FIG. 11 shows a plan view, comparable to FIG. 6, of an example of a 16 spot configuration, targeted for throughput requirements at the 50 nm node. Operation of this configuration will be essentially the same as of the main embodiment, with some additional overlap to fill in the spaces between four-beam modules.

In an extension of the principle, the number of spots can be increased to an 8×8 array, etc. In a further example a 24 $\mu$m subfield, with each beamlet covering an area of 1 $\mu$m, would cover an array of 144 sectors. When operating at a current density of 100 A/cm2, the 4 beamlets are capable of performing exposures equivalent to a single spot with 400 A/cm2 current density.

The elements shown in FIG. 3 between plate 20 and the bottom may optionally be floated at a voltage near the beam voltage in order to reduce the requirements on the length of the deflection electrodes and the voltages required. Beam voltage may be increased in general, to aid in the reduction of space charge effects, or may be increased selectively in the vicinity of the crossover, in order to reduce the effects where they are most severe.

Calibration methods used in single spot shaped beam systems may be adapted to the multibeam system. By calibrating with each beamlet, one at a time, offsets from the designed beamlet displacement may be detected and corrected for during the exposure stage. Individual variations in aperture size may be detected and compensated for by tailoring offsets in the shaping plate voltages, such that all beamlets produce identically sized spots. Coarse alignment of the beamlets to the apertures may be accomplished by means of alignment coils, while finer alignment may be maintained through use of the shaping plate offsets.

Spot to spot blanking within sectors is accomplished by fully shaping the beam while the spot is being repositioned, while during the position deflection moves from sector to sector, a separate blanker blocks all beamlets simultaneously in addition to the blanking from the full shaping. Addition of a separate blanking section enables additional attenuation of the beam during the relatively longer subfield-subfield and field to field stepping, limiting stray dose which may otherwise find its way onto the substrate. In the multibeam system combined with the conventional shaped beam optics as disclosed here, the apertures in plate 30 may be demagnified by over a factor of 200, correspondingly reducing any defects in workmanship. The constraints on building the deflectors is also eased as well. The invention described here makes use of a conventional LaB6 electron gun, so the single source eliminates problems of matching the emission currents of multiple sources. This system readily lends itself to calibration techniques based on scanning of targets to determine distortions and by the nature of the step and repeat architecture lends itself to a relatively simple correction path, not possible with the scanning system described by Groves and Kendall.

Fabrication

Preferably, microlithographic techniques illustrated in the cited patents of Groves are used to fabricate the electrodes and shaping apertures. Preferably, the electrodes are supported by a carbon plate, separated from it by an insulator, such as silicon oxide and disposed on the lower surface of the plate, so that stray electrons will be absorbed by the carbon. Also, the electrodes are preferably made from copper, since copper oxide is a conductor.

While the invention has been described in terms of a single preferred embodiment, those skilled in the art will recognize that the invention can be practiced in various versions within the spirit and scope of the following claims.

I claim:

1. A shaped-beam electron beam system for simultaneously directing a set of N individually controllable shaped beams (where N is at least two) on a workpiece, comprising:
    an electron gun for generating and directing an initial beam along an axis at a first set of N shaping apertures, disposed about said axis and each separated from one another transversely by a first separation distance, thereby generating a set of N sub-beams separated by said separation distance;

a first stage comprising a first set of individually controllable deflectors for independently positioning each of said N sub-beams individually with respect to a corresponding aperture of a second set of N shaping apertures to form said set of N sub-beams into a set of N independently shaped sub-beams, separated from one another transversely by individual separation distances;

a second stage comprising a second set of N individually controllable deflectors for positioning said set of N sub-beams transversely to form a Kth transverse intensity distribution of N spots positioned relative to one another corresponding to a Kth pattern to be imposed on said workpiece;

a third stage comprising a set of controllable collective deflectors for positioning said Kth transverse intensity distribution of N spots at a controllable Kth location on said workpiece.

2. A shaped-beam electron beam system according to claim 1, further including:

means for storing a representation of a stored pattern; and controllable beam control and deflection means for directing a set of M transverse intensity distributions of N spots at controllable Kth locations on said workpiece to form said stored pattern on said workpiece.

3. A shaped-beam electron beam system according to claim 1, in which:

said N spots of said Kth transverse intensity distribution are separated in two orthogonal transverse directions by an exposure range; and said system further includes sequencing means for directing overlapping (K+i)th intensity distributions to fill in areas left unpatterned by previous exposures.

4. A shaped-beam electron beam system according to claim 2, in which:

said N spots of said Kth transverse intensity distribution are separated in two orthogonal transverse directions by an exposure range; and said system further includes sequencing means for directing overlapping (K+i)th intensity distributions to fill in areas left unpatterned by previous exposures.

5. A shaped-beam electron beam system according to claim 3, in which:

N equals 4 and said pattern is exposed in a 4×8 module formed by two passes along a first direction, said two passes being offset in a second direction perpendicular to said first direction by one exposure range.

6. A shaped-beam electron beam system according to claim 4, in which:

N equals 4 and said pattern is exposed in a 4×8 module formed by two passes along a first direction, said two passes being offset in a second direction perpendicular to said first direction by one exposure range.

7. A shaped-beam electron beam system according to claim 3, in which:

N is greater than 4 and said pattern is exposed in a module formed by more than two passes along a first direction, said more than two passes being offset in a second direction perpendicular to said first direction by more than one exposure range.

8. A shaped-beam electron beam system according to claim 4, in which:

N is greater than 4 and said pattern is exposed in a module formed by more than two passes along a first direction, said more than two passes being offset in a second direction perpendicular to said first direction by more than one exposure range.

* * * * *